(12) United States Patent
Kamo et al.

(10) Patent No.: US 7,180,095 B2
(45) Date of Patent: Feb. 20, 2007

(54) DISPLAY DEVICE AND MANUFACTURING METHOD THEREOF

(75) Inventors: Takahiro Kamo, Mobara (JP); Toshihiko Itoga, Chiba (JP); Takuo Kaitoh, Mobara (JP); Makoto Ohkura, Fuchu (JP)

(73) Assignee: Hitachi Displays, Ltd., Mobara (JP)

( * ) Notice: Subject to any disclaimer, the term of this patent is extended or adjusted under 35 U.S.C. 154(b) by 0 days.

(21) Appl. No.: 10/780,724

(22) Filed: Feb. 19, 2004

(65) Prior Publication Data

US 2004/0217354 A1 Nov. 4, 2004

(30) Foreign Application Priority Data

Feb. 19, 2003 (JP) ............................ 2003-040812

(51) Int. Cl.
*H01L 29/15* (2006.01)

(52) U.S. Cl. ..................... 257/72; 257/66; 257/59; 257/88; 257/E29.277; 345/44; 345/82; 368/241; 438/48; 438/128; 438/149; 438/151

(58) Field of Classification Search .................. None
See application file for complete search history.

(56) References Cited

U.S. PATENT DOCUMENTS 6,919,235 B1* 7/2005 Yamazaki et al. .......... 438/149

FOREIGN PATENT DOCUMENTS

| JP | 8-195494 | 7/1996 |
|---|---|---|
| JP | 2000-091590 | 3/2000 |
| JP | 2000-223712 | 8/2000 |
| JP | 2000-357690 | 12/2000 |

* cited by examiner

*Primary Examiner*—Nathan J. Flynn
*Assistant Examiner*—Scott R. Wilson
(74) *Attorney, Agent, or Firm*—Antonelli, Terry, Stout and Kraus, LLP.

(57) ABSTRACT

In a display device including thin film transistors formed on an insulation substrate, the thin film transistor includes a semiconductor layer, a gate electrode and a gate insulation film which is interposed between the semiconductor layer and the gate electrode. The gate insulation film includes at least one layer of deposition film which is deposited by a deposition method, and the carbon concentration of the gate insulation film which is formed without interposing other deposition film deposited by a deposition method between the one deposition film and the semiconductor layer has the distribution in which the carbon concentration is smaller at a side close to the semiconductor layer than at a side remote from the semiconductor layer. Due to such a constitution, it is possible to obviate the elevation of a level of an interface of the insulation film with respect to a poly silicon layer and it is also possible to obviate an increase of fixed charges in the inside of the insulation film in the thin film transistor.

19 Claims, 9 Drawing Sheets

TEOS

H₅C₂O—Si(OC₂H₅)₃ structure

FIG. 7B

TEOS

|           | TEOS/O2 | DEPORATE(nm/min) |
|-----------|---------|------------------|
| plasmaCVD | 1 : 1   | 800              |
| plasmaCVD | 1 : 5   | 100              |
| UV-O3     |         | 2                |
| O2 plasma |         | 4                |

DISPLAY DEVICE AND MANUFACTURING METHOD THEREOF

BACKGROUND OF THE INVENTION

1. Field of the Invention

The present invention relates to a display device, and more particularly to a display device which is referred to as an active matrix type display device.

2. Description of the Related Art

For example, a liquid crystal display device of this type is configured such that a pair of substrates are arranged to face each other with liquid crystal therebetween and, on a liquid-crystal-side surface of one of these substrates, g ate signal lines which extend in the x direction and are arranged in parallel in the y direction and drain signal lines which extend in the y direction and are arranged in parallel in the x direction are formed, wherein respective regions which are surrounded by these respective signal lines constitute pixel regions.

Then, each pixel region includes at least a thin film transistor which is driven in response to a scanning signal from the one-side gate signal line and a pixel electrode to which a video signal is supplied from the one-side drain signal line through the thin film transistor.

Further, on a liquid-crystal-side surface of one substrate or another substrate, counter electrodes which generate an electric field between the counter electrodes and the pixel electrodes and control the optical transmissivity of the liquid crystal are provided.

Still further, in recent years, there has been known a liquid crystal display device in which the thin film transistor has a semiconductor layer which is made of polysilicon (p-Si) and can be formed at a low temperature.

In the liquid crystal display device, with respect to the formation of a gate insulation film of the thin film transistor, the gate insulation film is usually formed by a method which can form the film at a relatively low temperature such as a CVD method, for example, while obviating a method which forms the film at a high temperature such as a high-temperature oxidation method.

However, the available gate insulation film is not always limited to the insulation film which is formed by the CVD method or the like. That is, there has been also known a gate insulation film having the multilayered structure which includes an insulation film formed by a low-temperature oxidation method or the like (Japanese Unexamined Patent Publication No. Hei8(1996)-195494, Japanese Unexamined Patent Publication No. 2000-91590, and Japanese Unexamined Patent Publication No. 2000-223712).

These constitutions are provided for reducing the interface level density of the thin film transistor or for obtaining other advantageous effects.

The liquid crystal display device having these thin film transistors formed of polysilicon is, usually, configured such that a scanning signal drive circuit which supplies scanning signals to gate signal lines or a video signal drive circuit which supplies video signals to drain signal lines and the like are formed on one substrate, while semiconductor layers of MIS (Metal Insulator Semiconductor) transistors which are incorporated into these peripheral circuits are also formed of polysilicon. This is because the MIS transistors can be formed along with the formation of the thin film transistors on pixel regions.

BRIEF SUMMARY OF THE INVENTION

However, when at least one layer of insulation film which is formed by a CVD method, for example, is provided as the gate insulation film of the thin film transistor formed of polysilicon as described above and the insulation film is directly brought into contact with a polysilicon layer, for example, it has been found that a following drawback arises.

That is, when the insulation film is formed by the CVD method, carbons contained in a raw material gas (TEOS, TMS or the like) thereof are trapped in the film and hence, it is confirmed that a level of an interface with the polysilicon layer is elevated and fixed charges in the insulation film are increased whereby the electrical reliability of the thin film transistor is deteriorated.

The present invention has been made under such circumstances and it is an object of the present invention to provide a display device which can obviate the elevation of a level of an interface of an insulation film with respect to a polysilicon layer in a thin film transistor and, at the same time, can obviate the increase of fixed charges in the insulation film.

To briefly explain the summary of representative aspects of the invention disclosed in this specification, they are as follows.

Here, in the following explanation of the respective aspects of the invention, a deposition film deposited by a deposition method refers to a film which is formed by a CVD method or the like, and is expressed as a concept which distinguishes the film from a film formed by a method such as an oxidation method or the like other than the deposition method.

Means 1.

A display device according to the present invention is, for example, a display device having thin film transistors formed on an insulation substrate, wherein
  the thin film transistor includes a semiconductor layer, a gate electrode and a gate insulation film which is interposed between the semiconductor layer and the gate electrode,
  the gate insulation film includes at least one layer of deposition film which is deposited by a deposition method, and
  the carbon concentration of one deposition film which is formed without interposing other deposition film deposited by a deposition method between the one deposition film and the semiconductor layer has the distribution in which the carbon concentration is smaller at a side close to the semiconductor layer than at a side remote from the semiconductor layer.

Means 2.

A display device according to the present invention is, for example, on the premise of the constitution of means 1, characterized in that with respect to the carbon concentration of the one deposition film, the carbon concentration at the side close to the semiconductor layer is equal to or less than $\frac{1}{10}$ the carbon concentration at the side remote from the semiconductor layer.

Means 3.

A display device according to the present invention is, for example, on the premise of the constitution of means 1 or 2, characterized in that with respect to the carbon concentration of the one deposition film, the carbon concentration at the side close to the semiconductor layer is 1E20 to 1E21 [$cm^{-3}$]

and the carbon concentration at the side remote from the semiconductor layer is 1E21 to 1E22 [cm$^{-3}$].

Means 4.

A display device according to the present invention is, for example, on the premise of the constitution of any one of means 1 to 3, characterized in that the one deposition film is a film which is deposited by a CVD method using a raw material gas containing carbons.

Means 5.

A display device according to the present invention is, for example, on the premise of the constitution of any one of means 1 to 4, characterized in that the gate insulation film includes an oxide film which is formed by a method other than a deposition method between the one deposition film and the semiconductor layer.

Means 6.

A display device according to the present invention is, for example, on the premise of the constitution of any one of means 1 to 5, characterized in that, in the thin film transistor, the semiconductor layer is arranged between the insulation substrate on which the thin film transistor is formed and the gate electrode.

Means 7.

A display device according to the present invention is, for example, on the premise of the constitution of any one of means 1 to 6, characterized in that the semiconductor layer includes a polycrystalline silicon layer.

Means 8.

A display device according to the present invention is, for example, on the premise of the constitution of any one of means 1 to 7, characterized in that the thin film transistor is an n-channel type thin film transistor.

Means 9.

A display device according to the present invention is, for example, on the premise of the constitution of any one of means 1 to 7, characterized in that the thin film transistor is an n-channel type thin film transistor having a single drain structure.

Means 10.

A display device according to the present invention is, for example, on the premise of the constitution of any one of means 1 to 7, characterized in that the thin film transistor is a p-channel type thin film transistor.

Means 11.

A display device according to the present invention is, for example, on the premise of the constitution of any one of means 1 to 10, characterized in that the semiconductor layer of the thin film transistor is a semiconductor layer having crystals having a size of 1 μm or more when measured at least in one direction.

Means 12.

A display device according to the present invention is, for example, on the premise of the constitution of any one of means 1 to 11, characterized in that the display device is a liquid crystal display device.

Means 13.

A display device according to the present invention is, for example, on the premise of the constitution of any one of means 1 to 11, characterized in that the display device is an organic EL display device.

Means 14.

A manufacturing method of a display device according to the present invention is a manufacturing method of a display device which includes thin film transistors on an insulation substrate, wherein the thin film transistor includes a semiconductor layer, a gate electrode and a gate insulation film arranged between the semiconductor layer and the gate electrode, and the gate insulation film includes at least one layer of a deposition film deposited by a deposition method, wherein at the time of forming one deposition film without interposing other deposition film deposited by a deposition method between the one deposition film and the semiconductor layer, one deposition film is formed such that the carbon concentration of one deposition film has the distribution in which the carbon concentration is smaller at a side close to the semiconductor layer than at a side remote from the semiconductor layer.

Means 15.

A manufacturing method of a display device according to the present invention is, for example, on the premise of the constitution of means 14, characterized in that, at the time of forming the one deposition film, the one deposition film is formed by a CVD method in which a flow rate ratio of a gas containing carbons to a gas containing no carbons is changed.

Means 16.

A manufacturing method of a display device according to the present invention is, for example, on the premise of the constitution of means 14 or 15, characterized in that, at the time of forming the one deposition film, the one deposition film is formed by a CVD method in which the flow rate ratio of the gas containing carbons to the gas containing no carbons is set small when the one deposition film is close to the semiconductor layer and is set large when the one deposition remote from the semiconductor layer.

Means 17.

A manufacturing method of a display device according to the present invention is a manufacturing method of a display device which includes thin film transistors on an insulation substrate, wherein the thin film transistor includes a semiconductor layer, a gate electrode and a gate insulation film arranged between the semiconductor layer and the gate electrode, and the gate insulation film includes at least one layer of a deposition film deposited by a deposition method, wherein at the time of forming one deposition film without interposing other deposition film deposited by a deposition method between the one deposition film and the semiconductor layer, the one deposition film is formed by a CVD method in which a flow rate ratio of a gas containing carbons to a gas containing no carbons is set small when the one deposition film is close to the semiconductor layer and is set large when the one deposition film is remote from the semiconductor layer.

Means 18.

A manufacturing method of a display device according to the present invention is, for example, on the premise of the constitution of means 17, characterized in that, at the time of forming the one deposition film, the one deposition film is formed by a CVD method by setting the flow rate ratio of the gas containing carbons to the gas containing no carbons at the time of starting the film formation smaller than at the time of finishing the film formation.

Means 19.

A manufacturing method of a display device according to the present invention is, for example, on the premise of the constitution of means 17 or 18, characterized in that, at the time of forming the gate insulation film, an oxide film is formed on the semiconductor layer using a method other than a deposition method and, thereafter, the one deposition film is formed by a deposition method.

It should be noted that, the present invention is not limited to the above-mentioned constitutions and various modifications are conceivable without departing from the technical concept of the present invention.

DETAILED DESCRIPTION OF THE INVENTION

Preferred embodiments of a display device according to the present invention are explained in detail in conjunction with drawings.

<<Equivalent Circuit>>

Figure 15A:
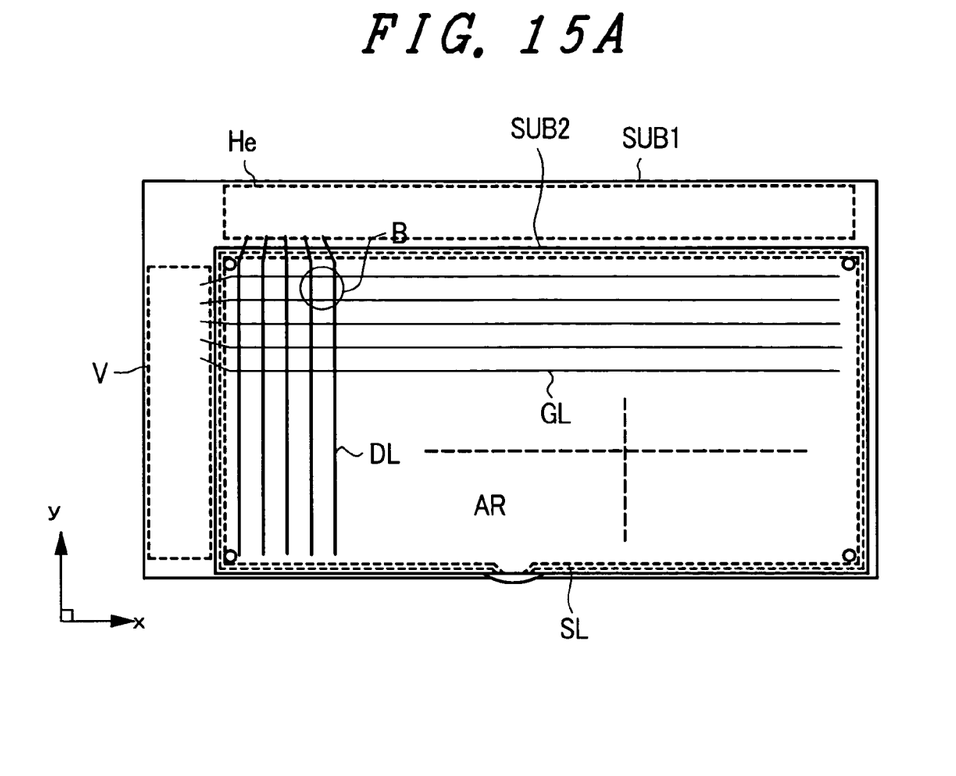
FIG. 15 is an equivalent circuit diagram showing one embodiment of the display device according to the present invention.
Figure 15B:
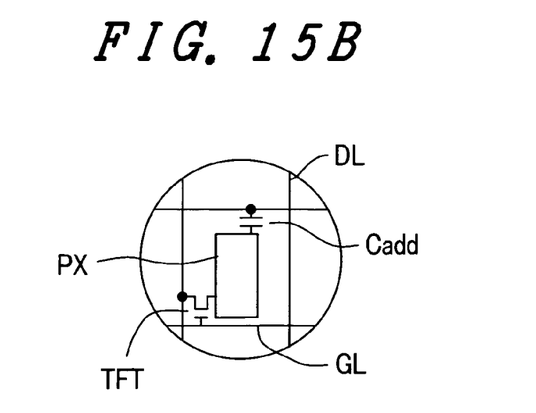

FIG. 15 is an equivalent circuit diagram showing one embodiment of a liquid crystal display device, for example.

In the drawing, there are provided a pair of transparent substrates SUB1, SUB2 which are arranged to face each other in an opposed manner with liquid crystal therebetween, wherein the liquid crystal is sealed by a sealing material SL which also performs a function of fixing another transparent substrate SUB2 to one transparent substrate SUB1.

On a liquid-crystal-side surface of one transparent substrate SUB1 which is surrounded by the sealing material SL, gate signal lines GL which extend in the x direction and are arranged in parallel in the y direction and drain signal lines DL which extend in the y direction and are arranged in parallel in the x direction are formed.

Regions which are surrounded by the respective gate signal lines GL and the respective drain signal lines DL constitute pixel regions and a mass of these respective pixel regions in a matrix array constitutes a liquid crystal display part AR.

In each pixel region, a thin film transistor TFT which is driven in response to a scanning signal from the one-side gate signal line GL and a pixel electrode PX to which a video signal is supplied from the one-side drain signal line DL via this thin film transistor TFT are formed.

The thin film transistor TFT, in this embodiment, has a semiconductor layer which is formed of polysilicon.

This pixel electrode PX generates an electric field between the pixel electrode PX and a counter electrode CT (not shown in the drawing) which is formed in common with the respective pixel regions on a liquid-crystal-side surface of the other transparent substrate SUB2 and controls the optical transmissivity of the liquid crystal in response to the electric field.

One end of the above-mentioned respective gate signal lines GL extends beyond the above-mentioned sealing material SL and the other end thereof is connected to a scanning signal drive circuit V and hence, scanning signals are supplied to the respective gate signal lines GL from the scanning signal drive circuit V.

Here, peripheral circuits such as the scanning signal drive circuit V and a video signal drive circuit He may be formed in the inner side of the sealing material SL.

In the same manner, one end of the above-mentioned respective drain signal lines DL extends beyond the above-mentioned sealing material SL and the other end thereof is connected to the video signal drive circuit He and hence, video signals are supplied to the respective drain signal lines DL from the video signal drive circuit He.

Each of the scanning signal drive circuit V and the video signal drive circuit He is constituted of a large number of complementary transistors each of which is constituted of an n-channel type MIS transistor and a p-channel type MIS transistor. The semiconductor layer of each transistor is formed of polysilicon.

Here, the MIS transistor is a thin film transistor having the substantially same constitution as the constitution of the thin film transistor TFT formed in the inside of the pixel region. Accordingly, although the MIS transistor has the same definition as the thin film transistor when the MIS transistor is referred to in this specification, in the explanation made hereinafter, when necessary, the MIS transistor is referred in a classified manner such as the thin film transistor in the inside of the pixel region and the MIS transistor in the inside of the scanning signal drive circuit V or the video signal drive circuit He.

The formation of the scanning signal drive circuit V and the video signal drive circuit He is performed along with the formation of the respective pixel regions, while the MIS transistors are formed along with the formation of the thin film transistors in the inside of the pixel regions.

In the liquid crystal display device having such a constitution, the respective gate signal lines GL are sequentially selected one after another in response to scanning signals from the scanning signal drive circuit V.

Further, to respective drain signal lines DL, the video signals are supplied from the video signal drive circuit He in conformity with the selection timing of the gate signal lines GL.

<<Thin Film Transistor>>

Figure 1:
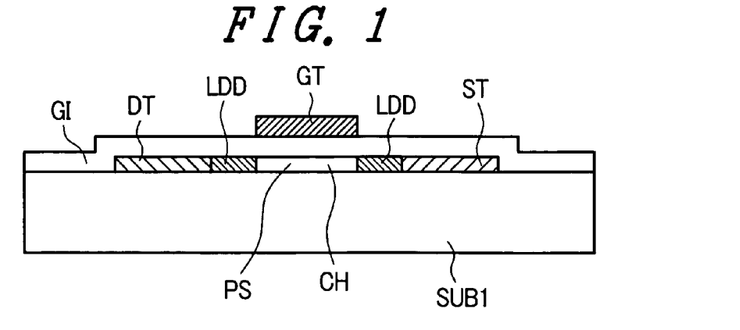
FIG. 1 is a cross-sectional view showing one embodiment of a thin film transistor of a display device according to the present invention.

FIG. 1 is a cross-sectional view showing one embodiment of the thin film transistor TFT shown in FIG. 15 and indicates an n-type channel type thin film transistor which is referred to as a top gate type transistor.

In the drawing, on a surface of the transparent substrate SUB1, the semiconductor layer PS formed of a polysilicon layer is formed. The semiconductor layer PS is formed by forming an amorphous Si film in a plasma CVD device, for example, and thereafter by polycrystallizing the amorphous Si film by excimer laser annealing (ELA), for example.

Here, the semiconductor layer PS may be formed such that a background layer made of SiO or SiN is formed on a surface of the transparent substrate SUB1 and, thereafter, the semiconductor layer PS is formed on an upper surface of the background layer. The background layer is provided for preventing ionic impurities contained in the transparent substrate SUB1 from imparting influences to the thin film transistor TFT.

On an upper surface of the semiconductor layer PS, an insulation film GI is formed such that the insulation film GI also covers regions on the transparent substrate SUB1 where the semiconductor layer PS is not formed. The insulation film GI also functions as a gate insulation film in regions where the thin film transistors TFT are formed.

On an upper surface of the insulation film GI, gate electrodes GT are formed such that the gate electrode GT traverse substantially the center of the semiconductor layer PS. The gate electrodes GT are electrically connected with the gate signal lines GL. In this case, the gate electrodes GT may be integrally formed with or separately formed from the gate signal lines GL.

The region of the semiconductor layer PS which is overlapped to the gate electrode GT is formed as a channel region CH of the thin film transistor TFT. Further, a region of the semiconductor layer PS which is arranged at one side with respect to the gate electrode GT is formed as a drain region DT and a region of the semiconductor layer PS which is arranged at another side with respect to the gate electrode GT is formed as a source region ST.

Here, in a circuit of the liquid crystal display device, polarities of the circuit are sometimes inverted during an operation thereof. That is, the drain region DT and the source region ST of the thin film transistor TFT are changed over during the operation. However, in the explanation made hereinafter, for the sake of convenience, the region at the side which is connected to the drain signal line DL is referred to as the drain region DT and the region at the side which is connected to the pixel electrode PX is referred to as the source region ST.

Here, in this embodiment, between the gate electrode GT and an end periphery of the drain region DT close to the gate electrode GT and between the gate electrode GT and an end periphery of the source region ST close to the gate electrode GT, so called LDD (Lightly Doped Drains) regions LDD are formed. These LDD regions LDD are formed for obviating the concentration of an electric field on a portion of the drain region DT or the source region ST which is disposed close to the gate electrode GT.

The drain region DT and the source region ST are doped with $n^+$ type impurities of high concentration, while the LDD regions LDD are doped with $n^-$ type impurities of low concentration. Doping of these impurities is performed through the above-mentioned insulation film GI by way of the above-mentioned gate electrode GT or other mask.

Here, the above-mentioned insulation film GI is formed by a deposition method such as a CVD method or the like, for example, wherein the insulation film GT is formed in such a state that the carbon concentration thereof is increased from a small value to a large value over a range from an interface side thereof with the semiconductor layer PS to another surface thereof (on which the gate electrode GT is formed).

In the thin film transistor TFT, to obviate the elevation of a level of the interface of the insulation film GI with respect to the semiconductor layer PS and also to obviate the increase of fixed charges in the insulation film GI, it may be conceived to decrease the carbon concentration over the whole region of the insulation film GI as an idea. However, when such an idea is adopted, a so-called deposition rate is largely reduced and hence, a throughput becomes extremely deteriorated. Accordingly, the present invention adopts the distribution of carbon concentration which is made small at the interface side of the semiconductor layer PS.

Figure 2A:
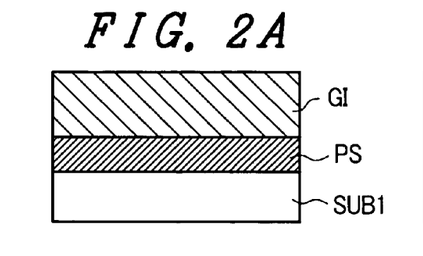
FIG. 2 is a cross-sectional view showing an embodiment of a gate insulation film of the thin film transistor of the display device according to the present invention.

FIG. 2(a) is a cross-sectional view showing one embodiment of the distribution of the carbon concentration in the above-mentioned insulation film GI formed on the upper surface of the semiconductor layer PS. The drawing shows that the carbon concentration is small at the interface side with the semiconductor layer PS and the carbon concentration is large at a surface opposite to the interface. In the drawing, a symbol expressed by + indicates carbon molecules and the coarseness and the denseness of the distribution shows the small carbon concentration and the large carbon concentration respectively.

Figure 3A:
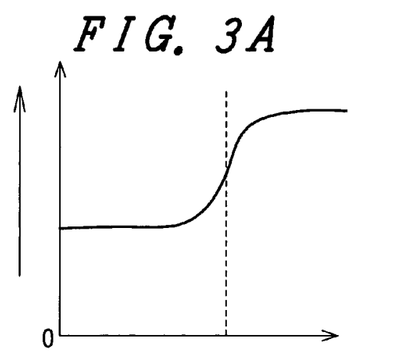
FIG. 3 is a graph showing an embodiment of the carbon concentration distribution of the gate insulation film of the thin film transistor of the display device according to the present invention.
Figure 3B:
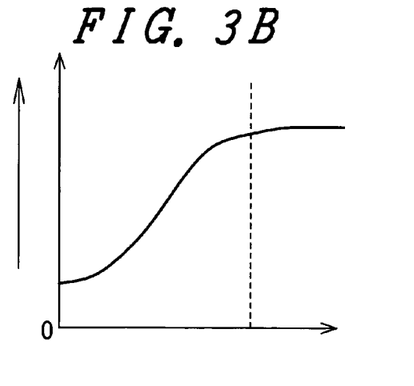

The distribution of the carbon concentration in the insulation film GI in the film thickness direction takes a change shown in FIG. 3(a), for example. Here, a film thickness distance from the interface with the semiconductor layer PS (the distance being increased corresponding to a deviation from the origin) is taken on an axis of abscissas and the carbon concentration (the carbon concentration being increased corresponding to a deviation from the origin) is taken on an axis of ordinates. Marking a boundary using a portion (a dotted portion in the drawing) which is several tens nm away from the interface with the semiconductor layer PS, the carbon concentration is low at the semiconductor layer PS side and is high at the side opposite to the semiconductor layer PS side. In the drawing, the carbon concentration of the insulation layer GI in a range from the interface to the portion which is several tens nm away from the interface is approximately $10^{20}$ to $10^{21}/cm^3$, for example, and the carbon concentration of the insulation layer GI in a range exceeding the portion which is several tens nm from the interface is approximately ten times as high as the above-mentioned carbon concentration, that is, approximately $10^{21}$ to $10^{22}/cm^3$, for example. Further, as shown in FIG. 3(b), the carbon concentration may be gradually increased in the range from the interface to the portion which is several tens nm away from the interface with the semiconductor layer (the portion being increased corresponding to a deviation from the origin).

Figure 2B:
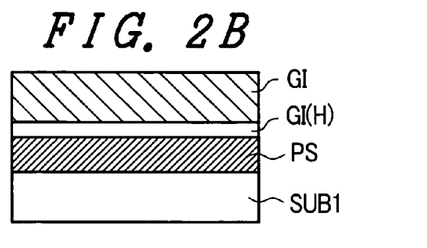

FIG. 2(b) shows another embodiment of the above-mentioned thin film transistor TFT and corresponds to FIG. 2(a). In this embodiment, an insulation film of the thin film transistor TFT has the two-layered structure which is constituted of an insulation film GI(H) which is formed by a low-temperature oxidation method and an insulation film GI which is formed by a CVD method in order from a semiconductor layer PS side.

The insulation film GI(H) which is formed by the low-temperature oxidation method has a film thickness of approximately 2 nm, while the insulation film GI which is formed by the CVD method on an upper surface of the insulation film GI(H), in the same manner as the insulation film shown in FIG. 2(a), has the small carbon concentration at an interface side with the insulation film GI(H) and has the large carbon concentration at the surface side opposite to the interface side.

Figure 3C:
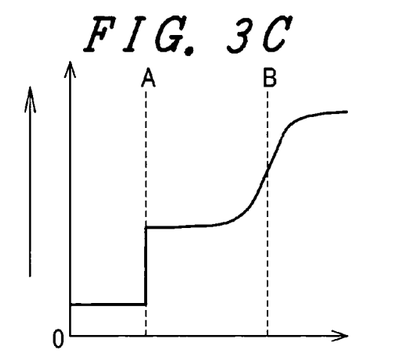
Figure 3D:
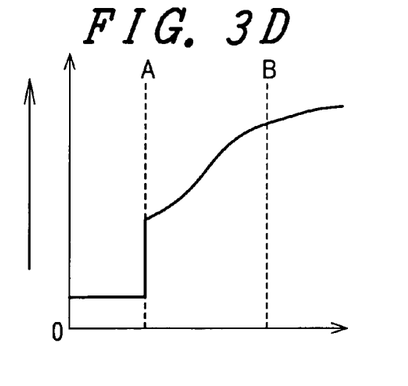

FIG. 3(c) shows, in the same manner as FIG. 3(a), the distribution of carbon concentration of the insulation film GI in the film thickness direction. As shown in FIG. 3(c), the carbon concentration is uniformly low (equal to or less than $10^{20}/cm^3$, for example) in a range from the interface with the semiconductor layer to a portion which is 2 nm away from the interface with the semiconductor layer (indicated by a dotted line A), is increased like a step at the portion which is 2 nm away from the interface, and is increased gently but like a step at a portion which is several tens nm away from the interface (indicated by a dotted line B). Further, the distribution of the carbon concentration is not limited to these distributions. For example, as shown in FIG. 3(d), the carbon concentration may be set such that the carbon concentration is increased like a step at the portion (indicated by a dotted line A) which is 2 nm away from the interface with the semiconductor layer PS and, thereafter, is gradually increased from the portion A to a portion which is several tens nm away from the interface with the semiconductor layer PS (indicated by a dotted line B) and, thereafter, is set to a substantially fixed value.

Even when the insulation film of the thin film transistor TFT is formed in this manner, since the carbon concentration of the insulation film GI in the vicinity of the interface with the semiconductor layer PS is extremely small and hence, it is possible to obviate the elevation of the level of the interface of the insulation film GI with respect to the semiconductor layer PS and, at the same time, the increase of the fixed charges in the insulation film GI can be obviated. Further, since the carbon concentration of the insulation layer GI is high except in the portion thereof close to the interface with the semiconductor layer PS, a so-called deposition rate is not decreased and hence, the deterioration of throughput can be prevented.

Here, although the explanation of the above-mentioned embodiment has been made with respect to the so-called top-gate type thin film transistor, it is needless to say that this embodiment is also applicable to a so-called bottom-gate type thin film transistor. Also in this case, a gate insulation film may be formed such that the carbon concentration is set low at an interface side thereof with the semiconductor layer and is set high at a side opposite to the interface.

<<Characteristics of Thin Film Transistor>>

Figure 4:
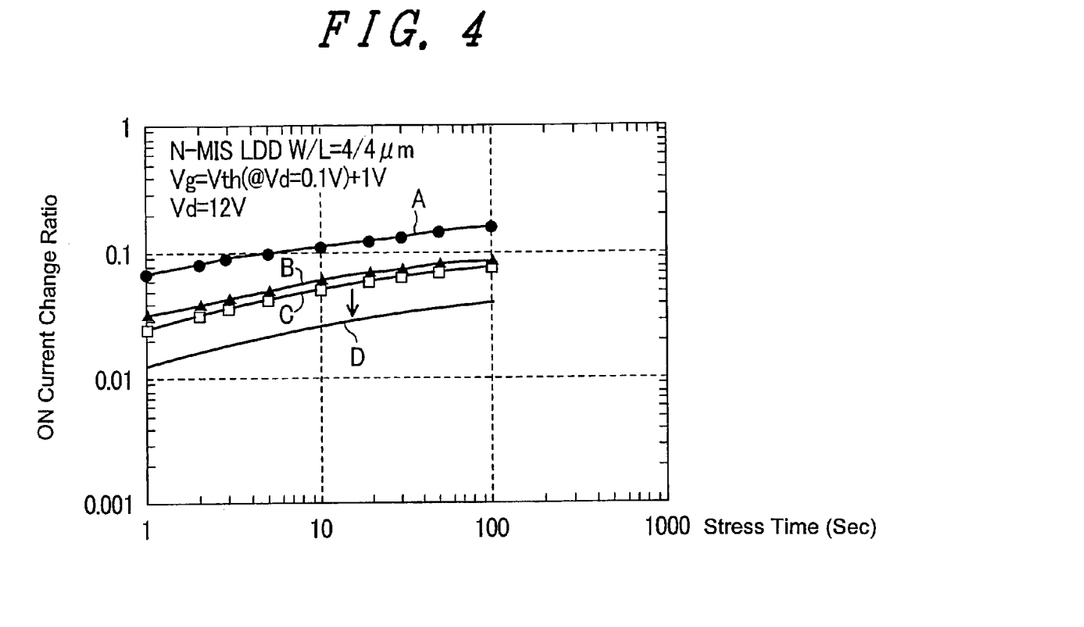
FIG. 4 is a graph showing characteristics of the thin film transistor of the display device according to the present invention.

FIG. 4 is a graph showing the characteristics of the thin film transistor having the above-mentioned constitution on the ON current change ratio with respect to a stress period. In the drawing, the stress time (sec) is taken on an axis of abscissas and the ON current change ratio is taken on an axis of ordinates.

With respect to thin film transistors TFT which are used as test pieces, one thin film transistor TFT has an insulation layer of two-layered structure consisting of an insulation film GI(H) formed by a low-temperature oxidation method and an insulation film GI formed by a CVD method, and another thin film transistor TFT has a structure which is constituted of only an insulation film GI formed by a CVD method.

Here, the insulation film GI(H) formed by the low-temperature oxidation method, has a portion oxidized by plasma the covering range of which is from an interface with the semiconductor layer PS to a position 4 nm away from the interface.

Further, the measurement is performed by using the thin film transistors TFT which exhibit the substantially equal initial characteristics (mobility, S value). Here, the thin film transistors TFT which are n-channel type thin film transistors in which the LDD region LDD has a width of 1 μm and a channel-width W/channel-length L ratio is set to 4/4 μm are used. With respect to a stress condition, a drain avalanche hot carrier (DAHC) stress having a gate voltage Vth(@Vd=0.1V)+1V, Vd=12V is used.

In the drawing, four characteristic curves A, B, C, and D are shown. In order from the top, the characteristic curve A is a curve obtained when the insulation film is formed by the CVD method without applying this embodiment to the thin film transistor TFT, the characteristic curve B is a curve obtained when the insulation film is formed of the insulation film having the two-layered structure consisting of the insulation film formed by a low temperature oxidation method and the insulation film formed by the CVD method without applying this embodiment to the thin film transistor TFT, the characteristic curve C is a curve obtained when the insulation film is obtained by the CVD method by applying this embodiment to the thin film transistor TFT, and the characteristic curve D is a curve obtained when the insulation film is formed of the insulation film having the two-layered structure consisting of the insulation film formed by a low temperature oxidation method and the insulation film formed by the CVD method by applying this embodiment to the thin film transistor TFT.

As can be clearly understood from the graph, the thin film transistors TFT having two respective characteristic curves C, D counted from bottom in the drawing, that is, the thin film transistors TFT which impart the carbon concentration distribution to the insulation film GI formed by deposition method by applying this embodiment exhibit the small ON current change ratio with respect to stress time and hence, the reliability of the thin film transistors TFT is enhanced.

<<Manufacturing Method>>

FIG. 5(a) to FIG. 5(e) and FIG. 6(f) to FIG. 6(i) are step views showing one embodiment of the manufacturing method of the above-mentioned thin film transistor TFT. Here, the n-channel type MIS transistor (expressed as N-MIS in the drawing) is arranged at the left side in the drawing and the p-channel type MIS transistor (expressed as P-MIS in the drawing) is arranged at the right side in the drawing.

As described previously, the thin film transistor TFT formed in the inside of the pixel region is usually formed of the n-channel type thin film transistor, while a large number of n-channel type and a large number of p-channel type complementary MIS transistors are formed in the inside of the video signal drive circuit and the scanning signal drive circuit, and these transistors are manufactured in parallel.

In view of the above, FIG. 5 and FIG. 6 depict the n-channel type MIS transistor and the p-channel type MIS transistor in parallel in respective steps of the manufacturing method.

Hereinafter, the manufacturing method is explained in order of the steps.

Step 1. (FIG. 5(a))

Figure 5A:
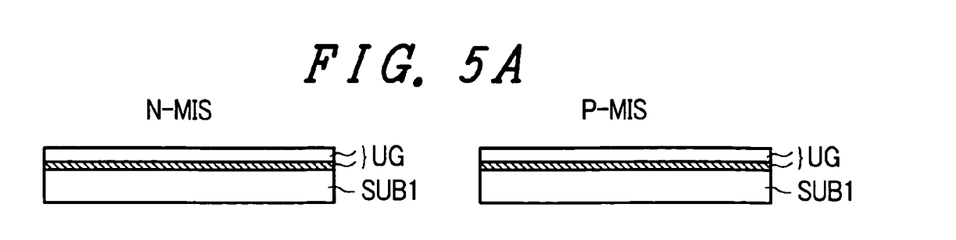
FIG. 5 is a step view showing one embodiment of a manufacturing method of an MIS transistor of the display device according to the present invention together with FIG. 6.

First of all, a silicon nitride film and a silicon oxide film are sequentially formed on a main surface of a transparent substrate SUB1. These films constitute a background layer UG and are provided for preventing the intrusion of sodium impurities from the transparent substrate SUB1 into a thin film transistor TFT which is to be formed on an upper surface of these films.

Step 2. (FIG. 5(b))

Figure 5B:
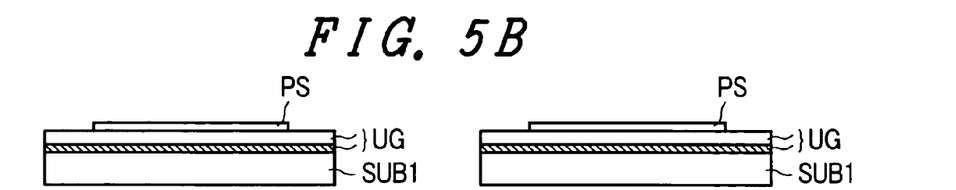

An amorphous silicon film is formed on an upper surface of the background layer UG and excimer laser annealing (ELA) is applied to the amorphous silicon film so as to form a semiconductor layer PS by polycrystallizing the amorphous silicon film. Then, the semiconductor layer PS is formed into an island pattern by a photolithography etching method.

Step 3. (FIG. 5(c))

Figure 5C:
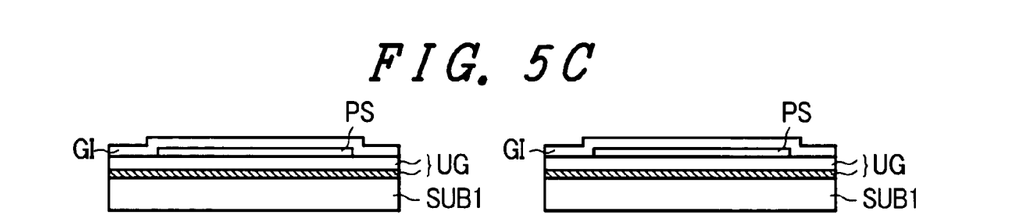

An insulation film GI is formed on the surface of the transparent substrate SUB1 such that the insulation film GI also covers the semiconductor layer PS. The insulation film GI is formed by a so-called deposition method such as a CVD method or the like.

Figure 7A:
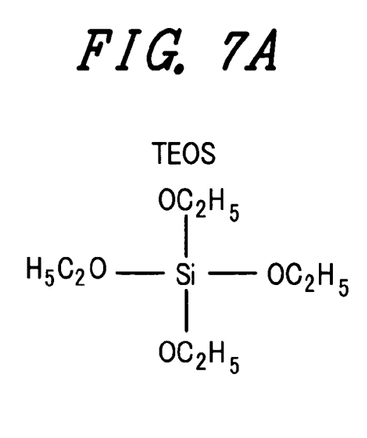
FIG. 7 is a molecular structural formula showing one embodiment of a component of a raw material gas at the time of forming a gate insulation film of the thin film transistor of the display device according to the present invention using a deposition film.
Figure 7B:
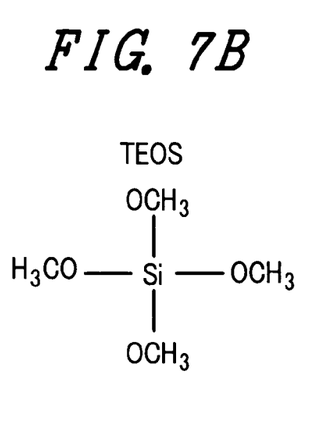
Figure 7C:
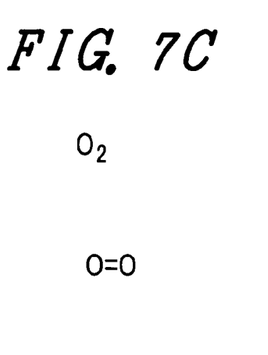

As a raw material gas, for example, tetraethoxy silane (TEOS) having a structural formula shown in FIG. 7(a), tetramethoxy silane (TMS) having a structural formula shown in FIG. 7(b) or oxygen ($O_2$) having a structural formula shown in FIG. 7(c) is used.

In this case, a raw material gas which is a combination of tetraethoxy silane and oxygen or a raw material gas which is a combination of tetramethoxy silane and oxygen may be also used.

As can be understood from the above-mentioned structural formulae, either one of tetraethoxy silane and tetramethoxy silane includes carbon atoms and hence, the insulation film GI which is formed using these components as the raw material gas is formed in a state that the insulation film GI inevitably contains carbons.

In forming the insulation film GI by the CVD method using such a raw material gas, a $TEOS.TMS/O_2$ flow rate ratio, a $TEOS/O_2$ flow rate ratio or a $TMS/O_2$ flow rate ratio of the raw material gas which is made to flow into the inside of a chamber is controlled, wherein the flow rate ratio is changed in an increasing manner from a small value to a large value.

Tetraethoxy silane and tetramethoxy silane respectively contain carbons and, in forming the insulation film using tetraethoxy silane or tetramethoxy silane, the above-mentioned flow rate ratio control is performed such that a carbon quantity is small at an initial stage and the carbon quantity is increased thereafter.

Figure 8:
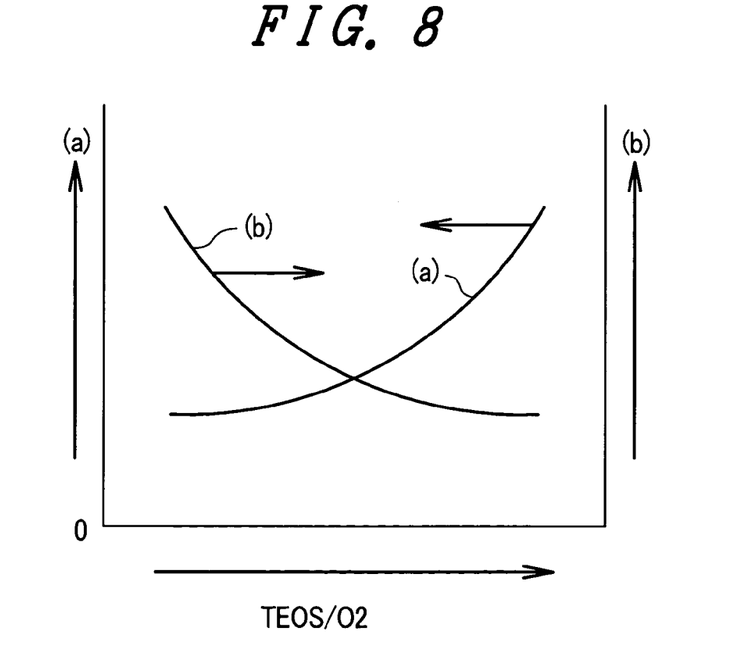
FIG. 8 is a graph showing the relationship between a deposition rate and a film quality at the time of forming a gate insulation film of the thin film transistor of the display device according to the present invention using a deposition film.

When the combination of tetraethoxy silane (TEOS) and oxygen ($O_2$) is used as the raw material gas, in the formation of the above-mentioned insulation film, the $TEOS/O_2$ flow rate ratio is changed in an increasing manner from the small value to the large value. FIG. 8 shows the relationship between a deposition rate and a film quality in the formation of the insulation film. In the drawing, the $TEOS/O_2$ flow rate ratio (increased corresponding to deviation from an origin) is taken on an axis of abscissas, while a deposition rate (faster corresponding to a deviation from an origin) and a film quality (improved corresponding to a deviation from an origin) are taken on an axis of ordinates.

As expressed by a characteristic curve (a) which indicates the deposition rate, although the deposition rate is slow in the first stage, the deposition rate gradually increases a speed thereof and hence, time required for the deposition rate as a whole is shortened. Further, as expressed by a characteristic curve (b) which indicates the film quality, it is apparent that the film quality is improved in the vicinity of an interface with the semiconductor layer PS where the improvement of the film quality is particularly required.

Here, prior to the formation of such an insulation film GI, as mentioned previously, an insulation film GI(H) may be formed on a surface of the semiconductor layer PS by a low-temperature oxidation method preliminarily.

In this case, it is preferable to set a film thickness of the insulation film GI(H) formed by a low-temperature oxidation method to 2 nm to 4 nm, for example. This is because the formation of the insulation film GI(H) requires a long growth time and hence, the film thickness is restricted to approximately 2 nm to 4 nm and a shortage of the film thickness is compensated by the insulation film GI which is formed on the insulation film GI(H) by the CVD method.

The insulation film GI(H) formed by the low-temperature oxidation method exhibits the favorable quality, wherein the insulation film GI(H) exhibits the carbon concentration of equal to or less than $10^{20}/cm^3$ in the portion which is 2 nm to 4 nm away from the interface with the semiconductor layer PS and assumes small values with respect to both of fixed charges and an interface level.

Here, as the low-temperature oxidation method, for example, an ozone ($O_3$) hydroxidation method, a UV-ozone ($O_3$) oxidation method, an ozone ($O_3$) oxidation method, an oxygen plasma oxidation method and the like are named and any one of these methods can be used.

Figure 9:
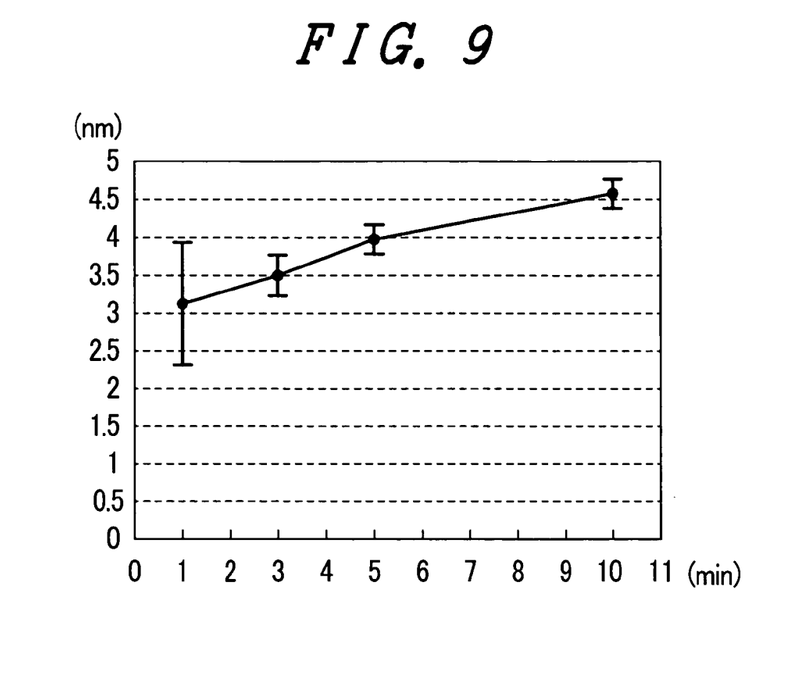
FIG. 9 is a graph showing the relationship between a treatment time and a thickness of an oxidation film at the time of forming a gate insulation film of the thin film transistor of the display device according to the present invention by an oxygen plasma method.
Figure 10:
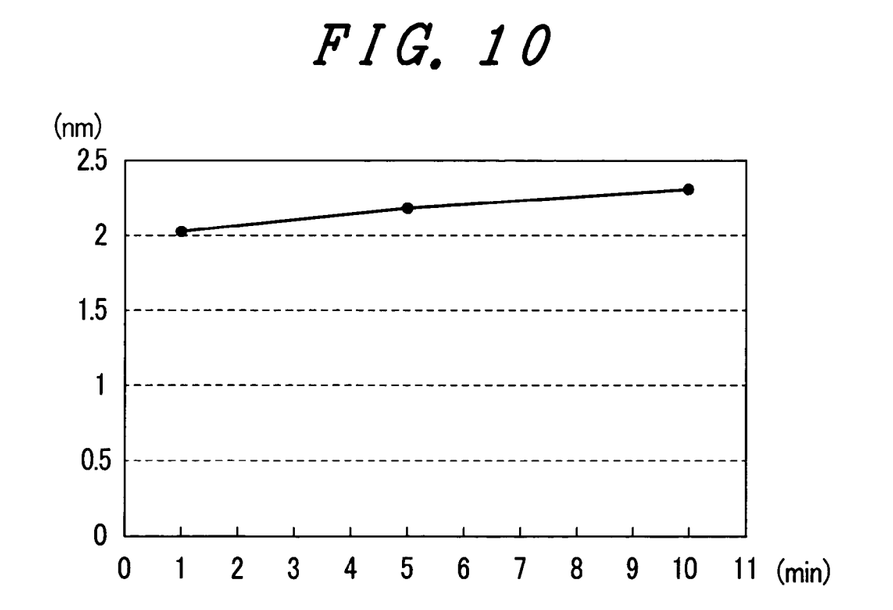
FIG. 10 is a graph showing the relationship between a treatment time and a thickness of an oxidation film at the time of forming a gate insulation film of the thin film transistor of the display device according to the present invention by a UV-$O_3$ method.

Here, FIG. 9 shows the relationship between a treatment time and an oxide film thickness when the oxygen plasma oxidation method is used and FIG. 10 shows the relationship between a treatment time and an oxide film thickness when the UV-ozone ($O_3$) oxidation method is used. Here, in both graphs, the treatment time (minute) is taken on an axis of abscissas and the oxide film thickness (nm) is taken on an axis of ordinates.

Figure 11:
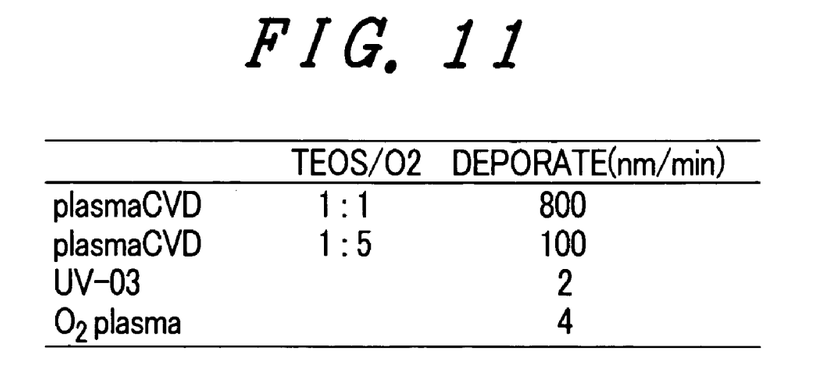
FIG. 11 is a table showing the relationship of deposition rates among respective methods at the timing of forming a gate insulation film of the thin film transistor of the display device according to the present invention.

After the formation of the insulation film by the low-temperature oxidation method in this manner, the insulation film formed by the CVD method is stacked. A deposition rate ratio in such a case is shown in FIG. 11. Although a plasma CVD method is used as the CVD method in the drawing, a case in which the TEOS/$O_2$ ratio is set to 1/1(1:1) and a case in which the TEOS/$O_2$ ratio is set to 1/5(1:5) are exemplified. Further, as the low-temperature oxidation method, the UV-$O_3$ oxidation method and the oxygen plasma oxidation method are exemplified.

As can be clearly understood from the drawing, the deposition rate by the low-temperature oxidation method is extremely small compared to the deposition rate by the CVD method and hence, the low-temperature method requires the long treatment time in the formation of the gate insulation film of the thin film transistor.

Figure 12:
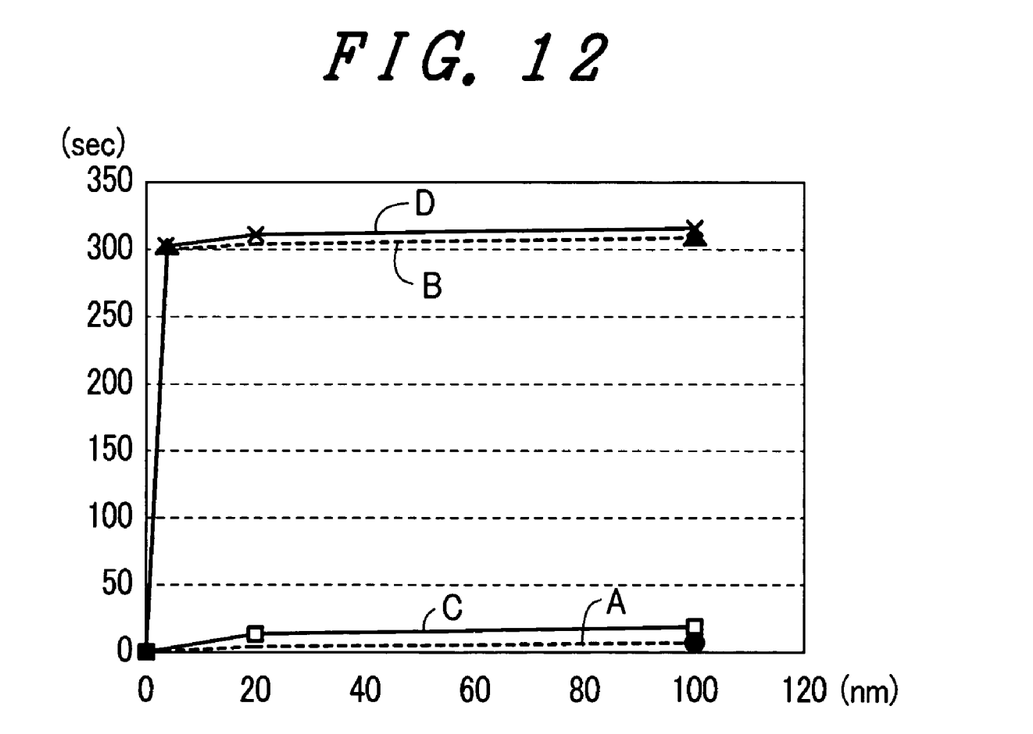
FIG. 12 is a graph showing the relationship between a film thickness and a film forming time at the time of forming the gate insulation film.

FIG. 12 is a graph which shows the film thickness dependency with respect to the film forming time in the formation of the insulation film GI. In the drawing, an insulation film thickness (nm) is taken on an axis of abscissas and an oxidation time (second) is taken on an axis of ordinates.

In the drawing, four characteristic curves A, B, C, and D are shown. In order from the top sequentially, the characteristic curve D is a curve obtained when the $O_2$ plasma method and the CVD method are used and the carbon concentration distribution exists, the characteristic curve B is a curve obtained when the $O_2$ plasma method and the CVD method are used and no carbon concentration distribution exists, the characteristic curve C is a curve obtained when the CVD method is used and the carbon concentration distribution exists, and the characteristic curve A is a curve obtained when the CVD method is used and no carbon concentration distribution exists.

The characteristics curves A, B, C, and D shown in FIG. 12 respectively correspond to the characteristics curves A, B, C, and D shown in FIG. 4.

Cases in which the gate insulation film is formed of only the film formed by the deposition method are exemplified by the characteristic curves A and C. Cases in which the gate insulation film has the two-layered structure formed of the film formed by the low-temperature oxidation method (which is not a deposition method) and the film formed by the deposition method are exemplified by the characteristic curves B and D. In these cases, the cases in which the carbon concentration distribution is imparted to the film formed by the deposition method by applying the present invention are indicated by the characteristic curves C and D.

It is understood that the characteristic curves A and C, which represent the cases of not using the low-temperature oxidation method, exhibit the extremely short time necessary for film formation and hence, exhibit the favorable throughput compared to the characteristic curves B and D which represent the cases of using the low-temperature oxidation method.

With respect to the characteristic curve C to which the present invention is applied, although the film forming time is slightly prolonged compared to the characteristic curve A as shown in FIG. 12, the difference is small and, further, the film formation speed is extremely fast compared to the characteristic curve B which uses the low-temperature oxidation method. Further, as can be understood from FIG. 4, the characteristic curve C not only largely enhances the characteristics compared to that of the characteristic curve A but also exhibits the characteristics which are substantially equal or slightly superior to the characteristics of the characteristic curve B obtained by using the low-temperature oxidation method.

With respect to the characteristic curve D to which the present invention is applied, although the film forming time is slightly prolonged compared to the characteristic curve B as shown in FIG. 12, the difference is small compared to the film forming time required by the low-temperature oxidation method and substantially no difference is observed between the characteristic curve D and the characteristic curve B. Further, as can be understood from FIG. 4, the characteristic curve D largely enhances the characteristics compared to the characteristics of the characteristic curves A, B, C.

As can be understood from the foregoing explanation, by imparting the given distribution to the carbon concentration in the film formed by the deposition method in the gate insulation film in accordance with the present invention, it is possible to form the thin film transistor having the favorable characteristics with a favorable throughput.

Figure 13A:
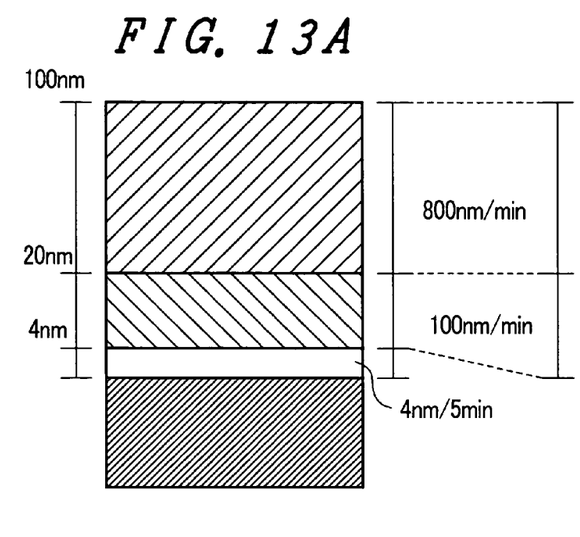
FIG. 13 is an explanatory view showing the relationship between a film thickness and a film forming rate at the timing of forming a gate insulation film of the thin film transistor of the display device according to the present invention.
Figure 13B:
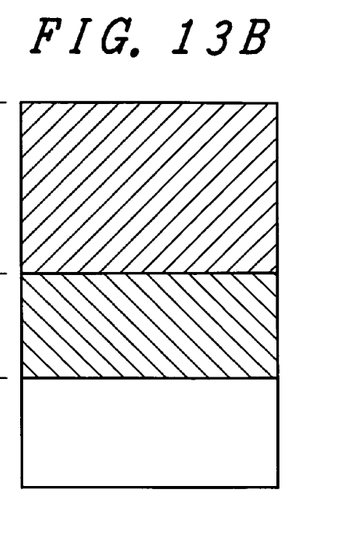

Further, FIG. 13 shows the relationship between a film forming rate (speed) and a thickness of the insulation film with respect to a case in which the low-temperature oxide film is interposed in the constitution of the insulation film of the thin film transistor TFT and the carbon concentration distribution is imparted to the insulation film formed by the CVD method (FIG. 13($a$)) and with respect to a case in which the low-temperature oxide film is not interposed in the constitution of the insulation film of the thin film transistor TFT and the carbon concentration distribution is imparted to the insulation film formed by the CVD method (FIG. 13($b$)) respectively in this embodiment.

That is, FIG. 13($a$) shows the film forming rates of respective films when a height from the interface with the semiconductor layer PS to an upper surface of the low-temperature oxide film is set to 4 nm, a height of an upper surface of the deposition film having the low carbon concentration is set to 20 nm and a height of an upper surface of the deposition film having the high carbon concentration is set to 100 nm. Here, the low-temperature oxide film is formed by the $O_3$ plasma method, for example, in five minutes. The deposition film having the low carbon concentration formed on the low-temperature oxide film is formed at a rate of 100 nm/min. Then, the deposition film having the high carbon concentration formed on the deposition film having the low carbon concentration is formed at a rate of 800 nm/min.

Further, FIG. 13($b$) shows the film forming rates of respective films when a height from the interface with the semiconductor layer PS to an upper surface of the deposition film having the low carbon concentration is set to 20 nm and a height of an upper surface of the deposition film having the high carbon concentration is set to 100 nm. Here, the deposition film having the low carbon concentration is formed at a rate of 100 nm/min and the deposition film having the high carbon concentration formed on an upper surface of the deposition film having the low carbon concentration is formed at a rate of 800 nm/min.

Step 4 (FIG. 5($d$))

Figure 5D:
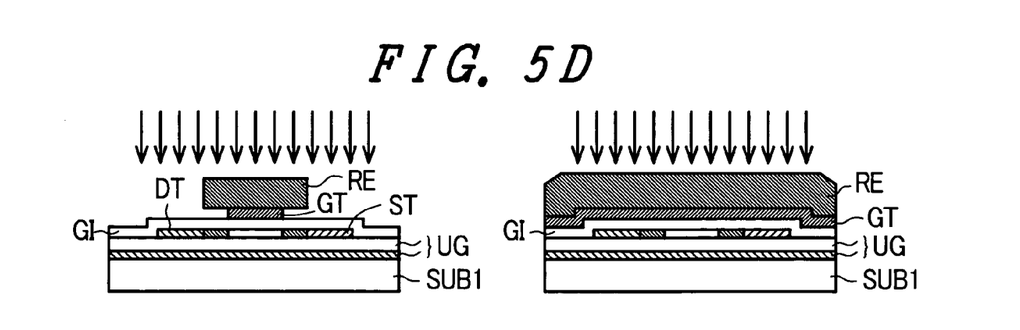

After forming a material layer of the gate electrode GT as a film, a photoresist film RE is formed and a mask for forming a pattern of the gate electrode GT is formed by the photoresist film RE in a region for forming the n-channel type thin film transistor TFT. In the region where the p-channel type thin film transistor is formed, masking is performed while leaving the above-mentioned photoresist film RE as it is.

The gate electrode GT is patterned to an extent that side etching of approximately 1am is performed with respect to the mask. A quantity of this side etching corresponds to a quantity of a width of the LDD regions LDD which are formed in a next step.

The $n^+$ impurities of high concentration are implanted using the photoresist film RE as the mask as it is. Accordingly, the semiconductor layer of the n-channel type thin film transistor is doped with the n$^+$ impurities through the insulation film GI, whereby the source region ST and the drain region DT are formed.

Figure 5E:
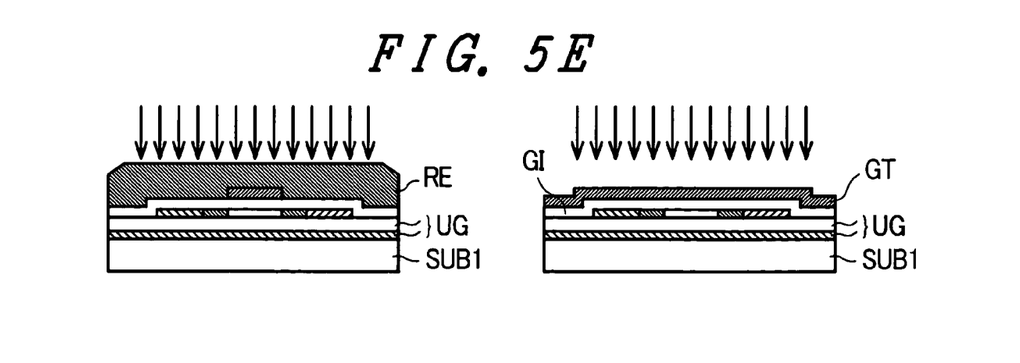

Step 5 (FIG. 5(e))

The photoresist film RE is removed and the n$^-$ impurities of low concentration are implanted. In the region where the n-channel type thin film transistor TFT is formed, the gate electrode GT performs a function of a mask and portions of the semiconductor layer PS which extend beyond the mask are doped with the n$^-$ impurities through the insulation film GI. Accordingly, between the source region ST and an end periphery of the gate electrode GT close to the source region ST as well as between the drain region DT and an end periphery of the gate electrode GT close to the drain region DT, the LDD regions LDD are respectively formed.

Here, in the region where the p-channel type thin film transistor TFT is formed, since the whole area is covered with the material layer of the gate electrode GT, there is no possibility that the semiconductor layer PS is doped with the impurities.

Figure 6F:
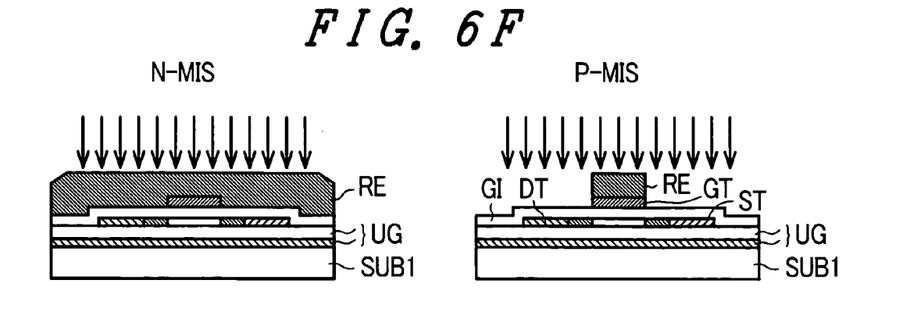
FIG. 6 is a step view showing one embodiment of a manufacturing method of an MIS transistor of the display device according to the present invention together with FIG. 5.

Step 6 (FIG. 6(f))

A photoresist film RE is formed on the whole area of the surface of the transparent substrate SUB1 and a mask for forming the gate electrode GT is formed by the photoresist film RE in the region where the p-channel type thin film transistor TFT is formed. In the region where the n-channel type thin film transistor TFT is formed, masking is performed while leaving the photoresist film RE as it is.

Then, by etching the material layer exposed from the mask, the gate electrode GT of the p-channel type thin film transistor TFT is formed. In this case, since the necessity of forming the LDD regions in the p-channel type thin film transistor TFT is small, the gate electrode GT is patterned without performing side etching.

Thereafter, using the photoresist film RE as the mask as it is, the p$^+$ impurities of high concentration are implanted. Accordingly, the semiconductor layer PS of the p-channel type thin film transistor TFT is doped with the p$^+$ impurities through the insulation film whereby the source region ST and the drain region DT are formed.

Figure 6G:
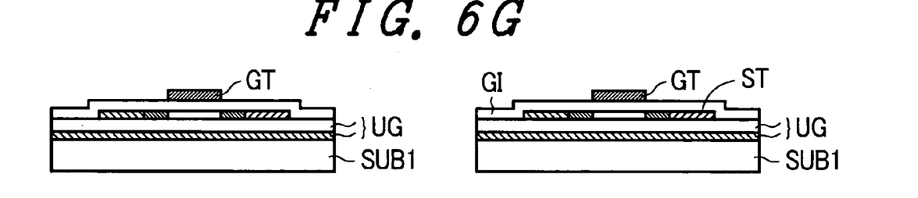

Step 7 (FIG. 6(g))

The photoresist film RE is removed. Accordingly, for example, the n-channel type thin film transistor TFT has the constitution similar to the constitution shown in FIG. 1.

Figure 6H:
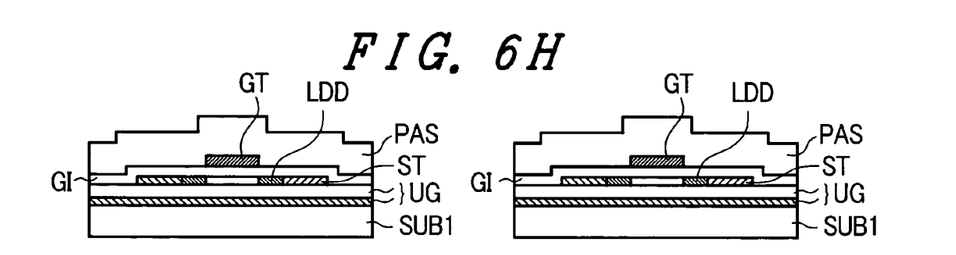

Step 8 (FIG. 6(h))

A protective film PAS is formed on the surface of the transparent substrate SUB1 on which the thin film transistors TFT are formed such that the protective film PAS also covers the thin film transistor TFT. This protective film PAS obviates the direct contact of the thin film transistor TFT with the liquid crystal so as to prevent the deterioration of characteristics of the thin film transistor TFT. The protective film may be an inorganic material such as a silicon nitride film, a silicon oxide film or the like, an organic material layer made of resin of the like, or a sequentially-stacked film formed of an inorganic material and an organic material.

Figure 6I:
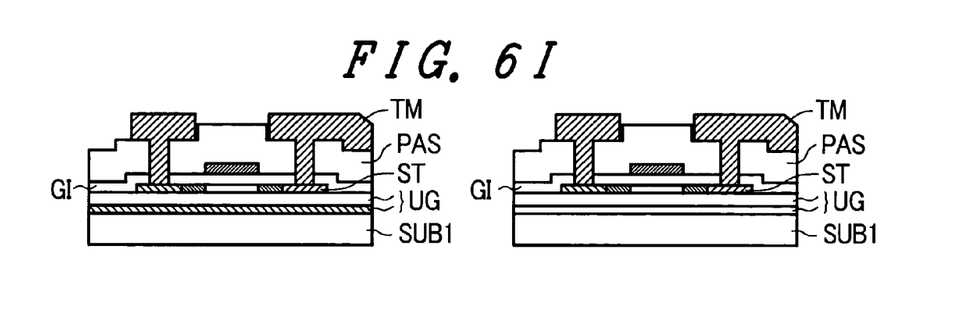

Step 9 (FIG. 6(i))

By forming holes which penetrate the protective film PAS and the insulation film GI disposed below the protective film PAS, the drain region DT and the source region ST of the thin film transistor TFT are partly exposed.

Then, electrodes TM which are respectively connected with the drain region DT and the source region ST are formed.

With respect to these electrodes, in case of the n-channel type thin film transistor which is formed in the inside of the pixel region, one electrode constitutes an electrode which is formed integrally with a drain signal line and another electrode constitutes an electrode which is connected with the pixel electrode PX. Further, provided that these thin film transistors are incorporated into a video signal drive circuit and a scanning signal drive circuit, these electrodes are formed as electrodes which are integrally or separately connected with wiring layers which are connected with electrodes of another thin film transistor.

<<Application to Liquid Crystal Display Panel>>

Figure 14A:
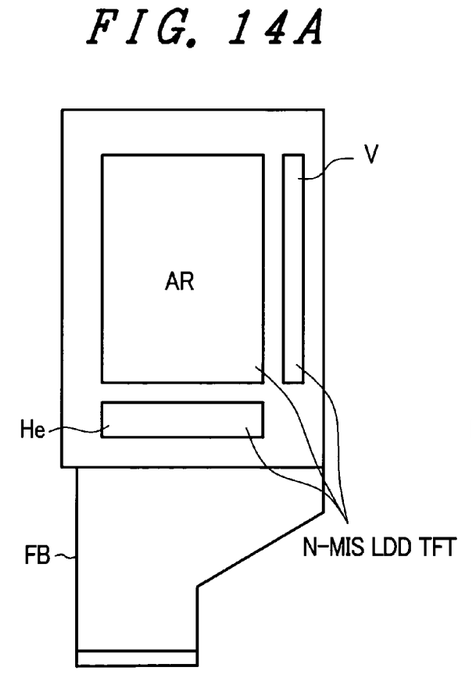
FIG. 14 is a plan view showing an embodiment of a liquid crystal display panel which is incorporated into a mobile phone to which the present invention is applied.

FIG. 14(a) is a plan view of one embodiment of a liquid crystal display panel which is incorporated into a display part of a mobile phone.

A scanning signal drive circuit V and a video signal drive circuit He are arranged in the vicinity of a liquid crystal display part AR as peripheral circuits, wherein each circuit is constituted of a large number of MIS transistors, wiring layers and the like which connect these MIS transistors and the like formed on a surface of one substrate out of respective substrates which are arranged to face each other with liquid crystal therebetween. In this case, the semiconductor layer of each MIS transistor is formed of polysilicon as mentioned previously and is formed in parallel with the thin film transistor in the inside of the pixel region.

Here, with respect to each MIS transistor, the n-channel type MIS transistor is of a type which forms LDD regions in the semiconductor layer.

In the liquid crystal panel, signals are respectively supplied to the scanning signal drive circuit V and the video signal drive circuit He through a flexible wiring layer FB.

Figure 14B:
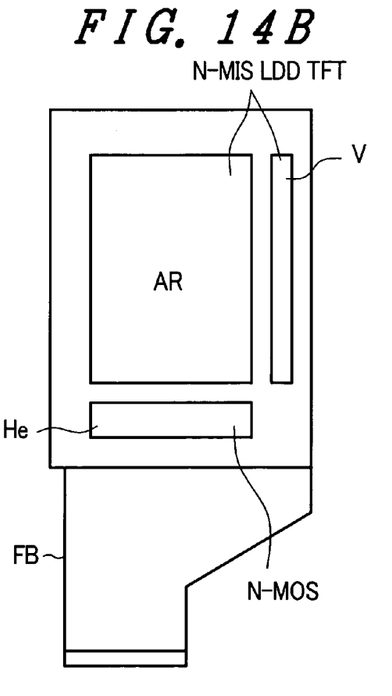

Further, FIG. 14(b) is a plan view of one embodiment of a liquid crystal display panel which is incorporated into a display part of a mobile phone and corresponds to FIG. 14(a).

The thin film transistors TFT in the inside of the liquid crystal display part AR and the MIS transistors in the scanning signal drive circuit V are required to perform driving of liquid crystal and hence, the thin film transistors TFT and the MIS transistors are formed of an n-channel type MIS transistor which uses a driving voltage of 12V and includes a semiconductor layer having LDD regions.

On the other hand, the MIS transistors in the inside of the video signal drive circuit He are required to exhibit characteristics thereof and hence, the MIS transistors are formed of an n-channel type MIS transistor which includes a semiconductor layer having no LDD regions (single drain transistor).

Here, since the semiconductor layer of the single drain transistor is not provided with the LDD regions, an electric field is increased at a gate-electrode-GT-side end of the drain region and hence, the signal drain transistor exhibits poor reliability. By applying the present invention to the gate insulation film, this drawback can be obviated.

The deterioration of reliability attributed to the DAHC stress is less apparent with respect to the p-channel type MIS transistor compared to the n-channel type MIS transistor. However, by making the gate insulation film of the p-channel type MIS transistor have the above-mentioned constitution, it is possible to obtain an advantageous effect that the initial characteristics are enhanced due to the reduction of fixed charges in the gate insulation film and the reduction of the interface level density.

For example, a particle size of polysilicon layer which is crystallized by ELA, for example, is approximately 0.3 to 1.0 μm. However, in future, along with the enhancement of polysilicon manufacturing technique, it is expected that the particle size of polysilicon layer will be increased to approximately 5 to 10 μm and hence, the mobility characteristics of the thin film transistor will be enhanced. This will necessitate the increase of a current which flows in the channel and hence, the influence of the deterioration mode attributed to DAHC will be increased along with the increase of the current. In view of the above, the advantageous effect obtained by the above-mentioned constitution of the gate insulation film is extremely significant.

The above-mentioned respective embodiments may be used in a single form or in combination. This is because the advantageous effects of the respective embodiment can be obtained in a single form or synergistically.

Further, although the thin film transistors provided with the LDD regions are illustrated as the n-channel type thin film transistor in the above-mentioned embodiments, it is needless to say that the present invention is applicable to a thin film transistor which has a so-called GOLD (Gate Overlapped LDD) structure. Here, the GOLD structure is a structure formed by making gate-electrode-side portions of LDD regions in the inside of a semiconductor layer overlapped to the gate electrode.

Further, although the explanation has been made with respect to the thin film transistors which are provided in the liquid crystal display device in the above-mentioned embodiments, it is needless to say that the present invention is applicable to thin film transistors provided in other display device such as an organic electro luminescence display device or a display device of other type, for example. This is because, for example, the organic EL display device is configured such that to one electrode of a pair of electrodes which are arranged with a light emitting layer sandwiched therebetween, in the same manner as the liquid crystal display device, a video signal from a drain signal line is supplied through a thin film transistor which is turned on in response to a scanning signal from a gate signal line.

As can be clearly understood from the foregoing explanation, according to the display device of the present invention, it is possible to obviate the elevation of the level of the interface of the insulation film with respect to the polysilicon layer in the thin film transistor and it is also possible to obviate the increase of the fixed charges in the inside of the insulation film.

The invention claimed is:

1. A display device including thin film transistors formed on an insulation substrate, wherein
the thin film transistor comprises a semiconductor layer, a gate electrode and a gate insulation film which is interposed between the semiconductor layer and the gate electrode, and
the carbon concentration of the gate insulation film has the distribution in which the carbon concentration at a side close to the semiconductor layer is equal to or less than $1/10$ the carbon concentration at a side remote from the semiconductor layer.

2. A display device according to claim 1, wherein the gate insulation film is a single layer disposed between the semiconductor layer and the gate electrode.

3. A display device according to claim 1, wherein the gate insulation film is a single layer of deposition film which is deposited by a deposition method and is disposed between the semiconductor layer and the gate electrode.

4. A display device according to claim 1, wherein the gate insulation film includes at least one layer of deposition film which is deposited by a deposition method and at least one other layer which is formed by other than a deposition method, the at least one other layer being interposed between the at least one layer of deposition film and the semiconductor layer, and the at least one layer of deposition film having the distribution in which the carbon concentration is smaller at a side close to the semiconductor layer than at a side remote from the semiconductor layer.

5. A display device according to claim 4, wherein the at least one other layer of the gate insulation film has a substantially uniform carbon concentration.

6. A display device according to claim 5, wherein the substantially uniform carbon concentration of the at least one other layer of the gate insulation film is smaller than the smallest carbon concentration of the at least one layer of deposition film.

7. A display device including thin film transistors formed on an insulation substrate, wherein
the thin film transistor comprises a semiconductor layer, a gate electrode and a gate insulation film which is interposed between the semiconductor layer and the gate electrode, and
the carbon concentration of the gate insulation film has the distribution in which the carbon concentration is smaller at a side close to the semiconductor layer than at a side remote from the semiconductor layer;
wherein the gate insulation film includes at least one layer of deposition film which is deposited by a deposition method, and which is formed by other than a deposition method and which is interposed between the one deposition film layer and the semiconductor layer, the one deposition film layer has the distribution in which the carbon concentration is smaller at a side close to the semiconductor layer than at a side remote from the semiconductor layer.

8. A display device including thin film transistors formed on an insulation substrate, wherein
the thin film transistor comprises a semiconductor layer, a gate electrode and a gate insulation film which is interposed between the semiconductor layer and the gate electrode, and
the carbon concentration of the gate insulation film has the distribution in which the carbon concentration is smaller at a side close to the semiconductor layer than at a side remote from the semiconductor layer;
wherein the gate insulation film includes at least one layer of deposition film which is deposited by a deposition method, and the carbon concentration of the one deposition film layer which is formed without interposing an other layer of deposition film deposited by a deposition method between the one deposition film layer and the semiconductor layer has the distribution in which the carbon concentration is smaller at a side close to the semiconductor layer than at a side remote from the semiconductor layer;
wherein with respect to the carbon concentration of the one deposition film layer, the carbon concentration at the side close to the semiconductor layer is equal to or less than $1/10$ the carbon concentration at the side remote from the semiconductor layer.

9. A display device according to claim 8, wherein with respect to the carbon concentration of the one deposition film layer, the carbon concentration at the side close to the semiconductor layer is 1E20 to 1E21 [$cm^{-3}$] and the carbon concentration at the side remote from the semiconductor layer is 1E21 to 1E22 $[cm^{-3}]$.

10. A display device according to claim 9, wherein the one deposition film layer is a film which is deposited by a CVD method using a raw material gas containing carbons.

11. A display device according to claim 10, wherein the gate insulation film includes an oxide film which is formed by a method other than a deposition method between the one deposition film layer and the semiconductor layer.

12. A display device according to claim 11, wherein in the thin film transistor, the semiconductor layer is arranged between the insulation substrate on which the thin film transistor is formed and the gate electrode.

13. A display device according to claim 12, wherein the semiconductor layer includes a polycrystalline silicon layer.

14. A display device according to claim 13, wherein the thin film transistor is an n-channel type thin film transistor.

15. A display device according to claim 13, wherein the thin film transistor is an n-channel type thin film transistor having a single drain structure.

16. A display device according to claim 13, wherein the thin film transistor is a p-channel type thin film transistor.

17. A display device according to claim 16, wherein the semiconductor layer of the thin film transistor is a semiconductor layer having crystals having a size of 1 μm or more when measured at least in one direction.

18. A display device according to claim 17, wherein the display device is a liquid crystal display device.

19. A display device according to claim 17, wherein the display device is an organic EL display device.

* * * * *